(12) United States Patent
Hong

(10) Patent No.: US 9,659,612 B1
(45) Date of Patent: May 23, 2017

(54) SEMICONDUCTOR MEMORY APPARATUS

(71) Applicant: SK hynix Inc., Icheon-si, Gyeonggi-do (KR)

(72) Inventor: Yun Gi Hong, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/166,780

(22) Filed: May 27, 2016

(30) Foreign Application Priority Data

Dec. 28, 2015 (KR) .................. 10-2015-0187869

(51) Int. Cl.
    *G11C 7/10* (2006.01)
    *G11C 7/12* (2006.01)
    *G11C 7/22* (2006.01)

(52) U.S. Cl.
    CPC ............ *G11C 7/1063* (2013.01); *G11C 7/109* (2013.01); *G11C 7/12* (2013.01); *G11C 7/22* (2013.01)

(58) Field of Classification Search
    CPC .................................................. G11C 7/1063
    USPC ................................. 365/189.17, 189.05, 221
    See application file for complete search history.

(56) References Cited

U.S. PATENT DOCUMENTS

| 8,780,645 | B2 * | 7/2014 | Park | G11C 29/824 |
| | | | | 365/189.02 |
| 2004/0095178 | A1 * | 5/2004 | Bang | G11C 7/103 |
| | | | | 327/215 |
| 2012/0008422 | A1 * | 1/2012 | Kim | G11C 7/04 |
| | | | | 365/189.05 |
| 2012/0057414 | A1 * | 3/2012 | Park | G11C 29/824 |
| | | | | 365/189.05 |
| 2012/0188827 | A1 * | 7/2012 | Lee | G11C 7/1018 |
| | | | | 365/189.05 |
| 2013/0135942 | A1 * | 5/2013 | Jeong | G11C 7/1039 |
| | | | | 365/189.05 |
| 2013/0279271 | A1 * | 10/2013 | Yoon | G11C 7/1039 |
| | | | | 365/189.05 |

FOREIGN PATENT DOCUMENTS

KR      1020090023784 A      3/2009

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A semiconductor memory apparatus may include a data storage region, a pipe register group, and an output driver. The data storage region may store data and output stored data as pipe input data. The pipe register group may include a plurality of pipe registers. In response to a plurality of coupling enable signals, a plurality of pipe input signals and a plurality of pipe output signals, the pipe register group may determine a number of pipe registers receiving the pipe input data and outputting pipe output data. The output driver may drive the pipe output data and transmit output data.

17 Claims, 5 Drawing Sheets

420

|  | C_en<0> | C_en<1> | C_en<2> |
|---|---|---|---|
| Dec_s<0> | L | L | L |
| Dec_s<1> | H | L | L |
| Dec_s<2> | H | H | L |
| Dec_s<3> | H | H | H |

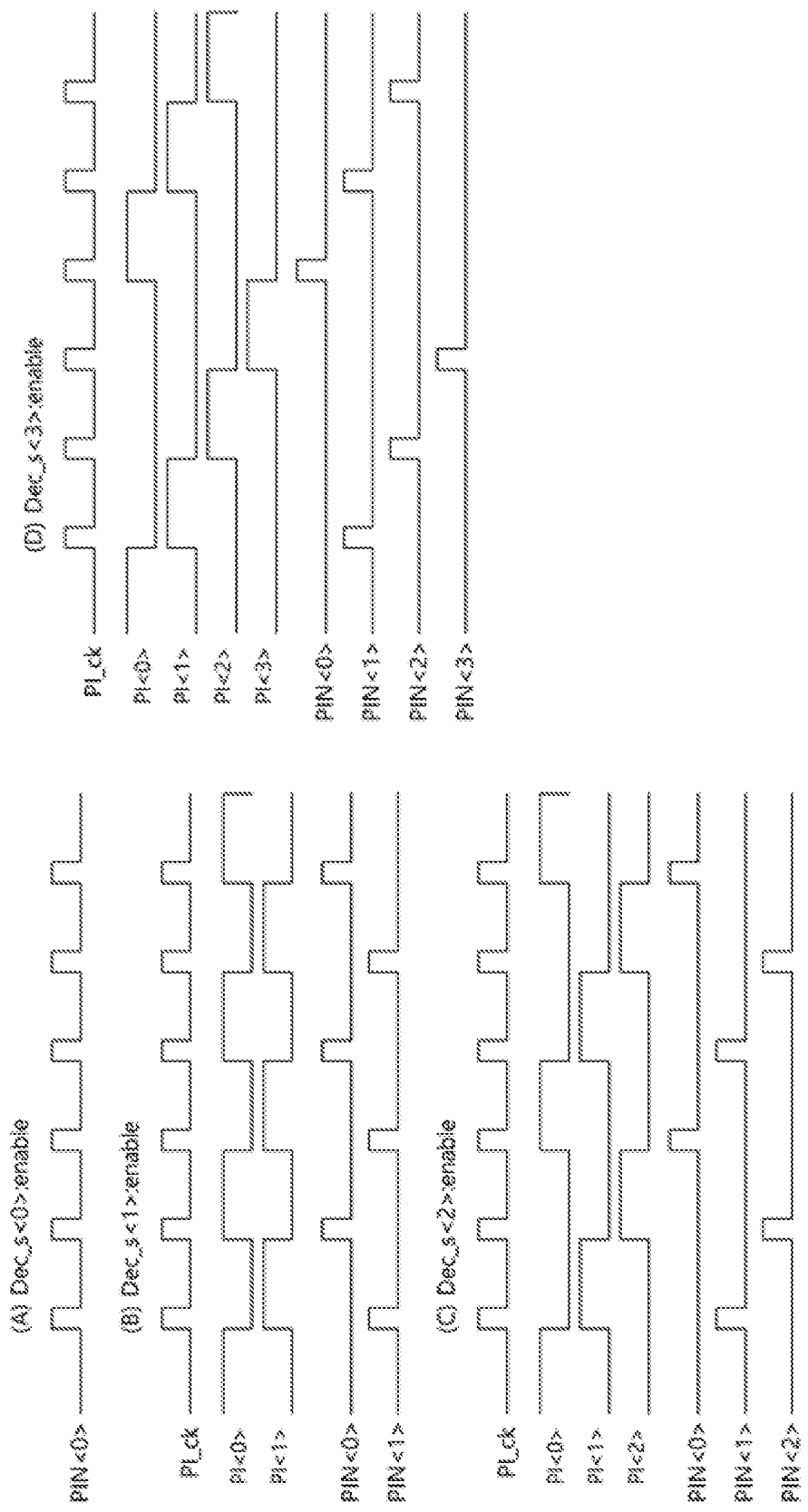

SEMICONDUCTOR MEMORY APPARATUS

CROSS-REFERENCES TO RELATED APPLICATION

The present application claims priority under 35 U.S.C. §119(a) to Korean application number 10-2015-0187869 filed on Dec. 28, 2015, in the Korean Intellectual Property Office, which is incorporated herein by reference in its entirety.

BACKGROUND

1. Technical Field

Various embodiments generally relate to a semiconductor integrated circuit, and, more particularly, to a semiconductor memory apparatus.

2. Related Art

In view of the current trend toward large capacity and high speed operation, semiconductor manufacturers are focusing primarily on the manufacturing of semiconductor memories capable of inputting/outputting a large amount of data during each read/write command.

In order to input/output a large amount of data at the same time, semiconductor memories may have a large number of pipe registers, but this may cause an increase in electrical loads.

SUMMARY

In an embodiment, a semiconductor memory apparatus may include a data storage region, a pipe register group, and an output driver. The data storage region may store data and output stored data as pipe input data. The pipe register group may include a plurality of pipe registers. In response to a plurality of coupling enable signals, a plurality of pipe input signals and a plurality of pipe output signal, the pipe register group may determine a number of pipe registers receiving the pipe input data and outputting pipe output data. The output driver may drive the pipe output data and transmit output data.

In an embodiment, a semiconductor memory apparatus may include a pipe register control circuit and a pipe register group. The pipe register control circuit may generate a plurality of coupling enable signals, a plurality of pipe input signals and a plurality of pipe output signals in response to memory setting signals. The pipe register group may include a plurality of pipe registers storing pipe input data in response to the plurality of coupling enable signals and the plurality of pipe input signals. The pipe register group may include a plurality of pipe register outputting stored signals as pipe output data in response to the plurality of coupling enable signals and the plurality of pipe output signals.

In an embodiment, a semiconductor memory apparatus may include a pipe register control circuit and a pipe register group. The pipe register control circuit may generate a plurality of coupling enable signals in response to memory setting signals. The pipe register group may include a plurality of pipe registers. In response to the plurality of coupling enable signals, the pipe register group may determine a number of pipe registers storing pipe input data and outputting stored signals as pipe output data.

BRIEF DESCRIPTION OF THE DRAWINGS

FIG. 6 is a timing diagram illustrating example operations of the semiconductor memory apparatus in accordance with an embodiment.

DETAILED DESCRIPTION

Hereinafter, a semiconductor memory apparatus will be described below with reference to the accompanying drawings through various examples of embodiments.

Figure 1:
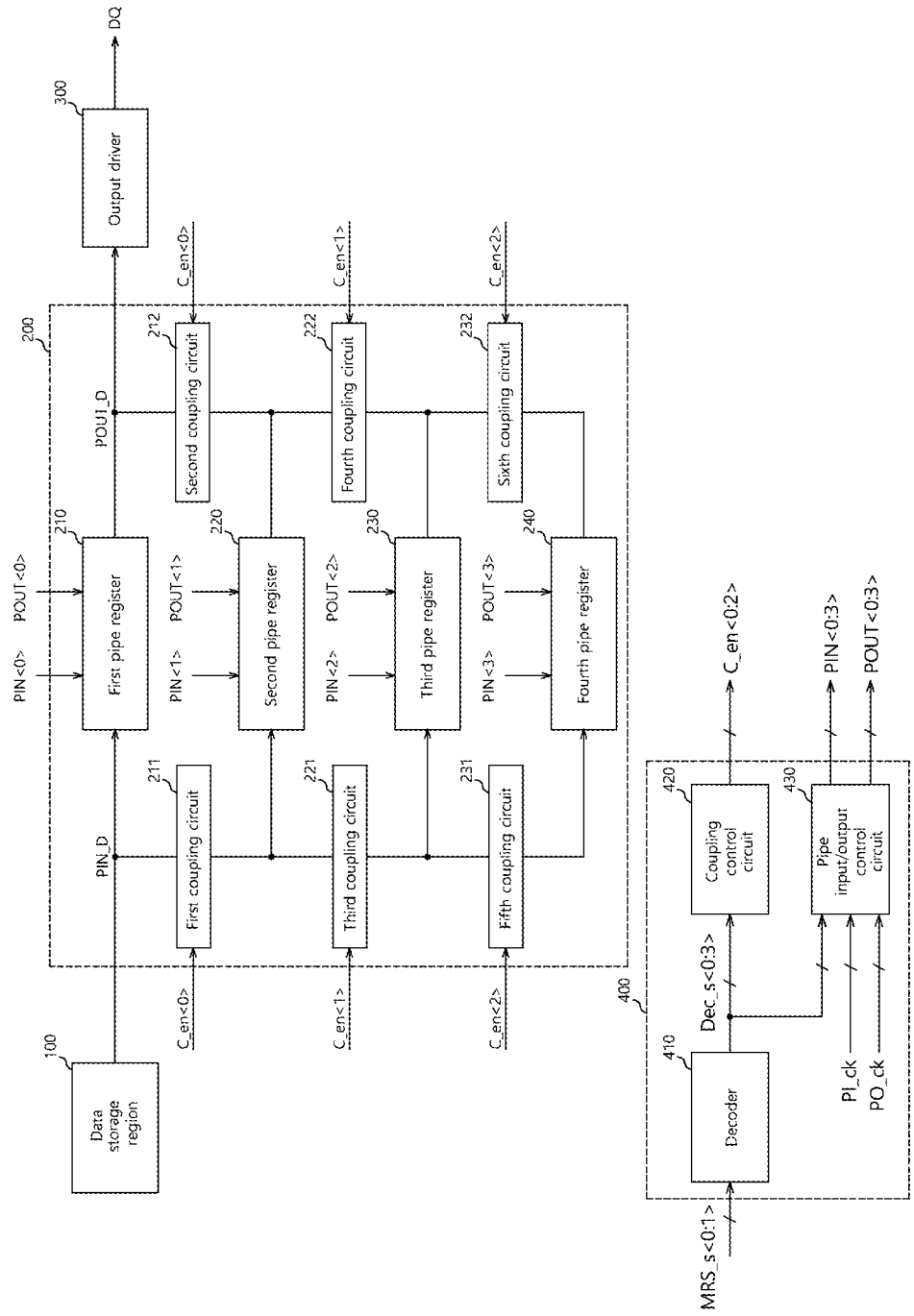
FIG. 1 is a diagram illustrating an example of a semiconductor memory apparatus in accordance with an embodiment.

In FIG. 1, a semiconductor memory apparatus in accordance with an embodiment may include a data storage region 100, a pipe register group 200, an output driver 300, and a pipe register control circuit 400.

The data storage region 100 may be electronic circuits that store data. For example, the data storage region 100 may be a memory cell array of the semiconductor memory apparatus. The data storage region 100 may output stored data as pipe input data PIN_D.

The pipe register group 200 may include first to fourth pipe registers 210, 220, 230 and 240. In response to first to third coupling enable signals C_en<0:2>, the pipe register group 200 may determine a number of pipe registers to be used in receiving/storing/outputting the pipe input data PIN_D.

The pipe register group 200 may include the first to fourth pipe registers 210, 220, 230 and 240, and first to sixth coupling circuits 211, 212, 221, 222, 231 and 232. Although FIG. 1 illustrates four pipe registers, it may be noted that this is for illustration purpose only, and the number of pipe registers may vary.

The first pipe register 210 may receive the pipe input data PIN_D in response to a first pipe input signal PIN<0> enabled. The first pipe register 210 may retain the pipe input data PIN_D until outputting it. The first pipe register 210 may output stored data as pipe output data POUT_D in response to a first pipe output signal POUT<0> enabled.

The first coupling circuit 211 may transfer the pipe input data PIN_D to the second pipe register 220 in response to the first coupling enable signal C_en<0> enabled. In response to the first coupling enable signal C_en<0> disabled, the first coupling circuit 211 may prevent the pipe input data PIN_D from being transferred to the second pipe register 220. The first coupling circuit 211 may include a switch.

The second coupling circuit 212 may couple an output terminal of the first pipe register 210 to an output terminal of the second pipe register 220 in response to the first coupling enable signal C_en<0> enabled so that data output from the second pipe register 220 may be output as the pipe output data POUT_D. In response to the first coupling enable signal C_en<0> disabled, the second coupling circuit 212 may prevent the respective output terminals of the first and second pipe registers 210 and 220 from being coupled to one another. The second coupling circuit 212 may include a switch.

The second pipe register 220 may receive the pipe input data PIN_D transferred from the first coupling circuit 211 in response to a second pipe input signal PIN<1> enabled. The second pipe register 220 may retain the pipe input data PIN_D until outputting it. The second pipe register 220 may output stored data as the pipe output data POUT_D through the second coupling circuit 212 in response to a second pipe output signal POUT<1> enabled.

The third coupling circuit 221 may transfer the pipe input data PIN_D, which has been transferred through the first coupling circuit 211, to the third pipe register 230 in response to the second coupling enable signal C_en<1> enabled. In response to the second coupling enable signal C_en<1> disabled, the third coupling circuit 221 may prevent the pipe input data PIN_D, which has been transferred through the first coupling circuit 211, from being transferred to the third pipe register 230. The third coupling circuit 221 may include a switch.

The fourth coupling circuit 222 may couple the output terminal of the second pipe register 220 and the output terminal of the third pipe register 230 in response to the second coupling enable signal C_en<1> enabled so that data output from the third pipe register 230 may be output as the pipe output data POUT_D. In response to the second coupling enable signal C_en<1> disabled, the fourth coupling circuit 222 may prevent the respective output terminals of the second and third pipe registers 220 and 230 from being coupled to one another. The fourth coupling circuit 222 may include a switch.

The third pipe register 230 may receive the pipe input data PIN_D transferred from the third coupling circuit 221 in response to a third pipe input signal PIN<2> enabled. The third pipe register 230 may retain the pipe input data PIN_D until outputting it. The third pipe register 230 may output stored data as the pipe output data POUT_D through the fourth coupling circuit 222 in response to a third pipe output signal POUT<2> enabled.

The fifth coupling circuit 231 may transfer the pipe input data PIN_D, which has been transferred through the third coupling circuit 221, to the fourth pipe register 240 in response to the third coupling enable signal C_en<2> enabled. In response to the third coupling enable signal C_en<2> disabled, the fifth coupling circuit 231 may prevent the pipe input data PIN_D, which has been transferred through the third coupling circuit 221, from being transferred to the fourth pipe register 240. The fifth coupling circuit 231 may include a switch.

The sixth coupling circuit 232 may couple the output terminal of the third pipe register 230 and the output terminal of the fourth pipe register 240 in response to the third coupling enable signal C_en<2> enabled so that data output from the fourth pipe register 240 may be output as the pipe output data POUT_D. In response to the third coupling enable signal C_en<2> is disabled, the sixth coupling circuit 232 may prevent the respective output terminals of the third and fourth pipe registers 230 and 240 from being coupled to one another. The sixth coupling circuit 232 may include a switch.

The fourth pipe register 240 may receive the pipe input data PIN_D transferred from the fifth coupling circuit 231 in response to a fourth pipe input signal PIN<3> enabled. The fourth pipe register 240 may retain the pipe input data PIN_D until outputting it. The fourth pipe register 240 may output stored data as the pipe output data POUT_D through the sixth coupling circuit 232 in response to a fourth pipe output signal POUT<3> enabled.

The output driver 300 may drive the pipe output data POUT_D and transmit output data DQ.

The pipe register control circuit 400 may generate the first to third coupling enable signals C_en<0:2>, the first to fourth pipe input signals PIN<0:3> and the first to fourth pipe output signals POUT<0:3> in response to memory setting signals MRS_s<0:1>. The memory setting signals MRS_s<0:1> may be signals output from a mode register set to be used for setting a function or an operation of the semiconductor memory apparatus or to be used in a test. For example, in response to the memory setting signals MRS_s<0:1>, the pipe register control circuit 400 may determine a number of coupling enable signals selected between the first to third coupling enable signals C_en<0:2> to be enabled, determine a number of pipe input signals selected between the first to fourth pipe input signals PIN<0:3> to be enabled, and determine a number of pipe output signals selected between the first to fourth pipe output signals POUT<0:3> to be enabled. For example, the pipe input signals selected between the first to fourth pipe input signals PIN<0:3> may be sequentially enabled, and the pipe output signals selected between the first to fourth pipe output signals POUT<0:3> may be sequentially enabled.

The pipe register control circuit 400 may include a decoder 410, a coupling control circuit 420, and a pipe input/output control circuit 430.

The decoder 410 may decode the memory setting signals MRS_s<0:1>, and generate first to fourth decoding signals Dec_s<0:3>. For example, the decoder 410 may enable one of the first to fourth decoding signals Dec_s<0:3> by decoding the memory setting signals MRS_s<0:1>.

The coupling control circuit 420 may generate the first to third coupling enable signals C_en<0:2> in response to the first to fourth decoding signals Dec_s<0:3>. For example, in response to the first to fourth decoding signals Dec_s<0:3>, the coupling control circuit 420 determines the number of coupling enable signals selected between the first to third coupling enable signals C_en<0:2> to be enabled. In an embodiment, the number of coupling enable signals that are enabled may vary depending on which decoding signal is enabled. For example, the coupling control circuit 420 may disable all the first to third coupling enable signals C_en<0:2> if the first decoding signal Dec_s<0> is enabled. The coupling control circuit 420 may enable the first coupling enable signal C_en<0>, among the first to third coupling enable signals C_en<0:2>, if the second decoding signal Dec_s<1> is enabled. The coupling control circuit 420 may enable the first and second coupling enable signals C_en<0> and C_en<1>, among the first to third coupling enable signals C_en<0:2>, if the third decoding signal Dec_s<2> is enabled. The coupling control circuit 420 may enable all the first to third coupling enable signals C_en<0>, C_en<1> and C_en<2> if the fourth decoding signal Dec_s<3> is enabled.

The pipe input/output control circuit 430 may determine the number of pipe input signals to be sequentially enabled, among the first to fourth pipe input signals PIN<0:3>, and may determine the number of pipe output signals to be sequentially enabled, among the first to fourth pipe output signals POUT<0:3>, in response to the first to fourth decoding signals Dec_s<0:3>. For example, the pipe input/output control circuit 430 may sequentially enable the first to fourth pipe input signals PIN<0:3> in response to the first to fourth decoding signals Dec_s<0:3> and a pipe input clock PI_ck. The pipe input/output control circuit 430 may sequentially enable the first to fourth pipe output signals POUT<0:3> in response to the first to fourth decoding signals Dec_s<0:3> and a pipe output clock PO_ck.

Figure 2:
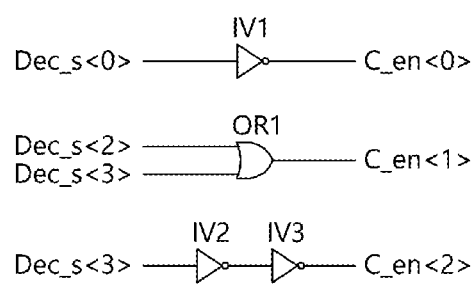
FIG. 2 is a diagram illustrating an example of the coupling control circuit illustrated in FIG. 1.

In FIG. 2, the coupling control circuit 420 may include first to third inverters IV1, IV2 and IV3 and an OR gate OR1.

The first inverter IV1 may output the first coupling enable signal C_en<0> in response to the first decoding signal Dec_s<0>.

The OR gate OR1 may output the second coupling enable signal C_en<1> in response to the third and fourth decoding signals Dec_s<2> and Dec_s<3>.

The second inverter IV2 may output an output signal in response to the fourth decoding signal Dec_s<3>.

The second and third inverters IV2 and IV3 may be coupled in series, and the third inverter IV3 may output the third coupling enable signal C_en<2> in response to the output signal of the second inverter IV2.

The coupling control circuit 420 in accordance with an embodiment may operate as follows.

If only the first decoding signal Dec_s<0> is enabled to a high level among the first to fourth decoding signals Dec_s<0:3>, the first inverter IV1 may output the first coupling enable signal C_en<0> disabled (e.g., a logic low level), and, since the OR gate OR1 and the second inverter IV2 receive the third and fourth decoding signals Dec_s<2:3> that are disabled, the OR gate OR1 and the third inverter IV3 may disable the second and third coupling enable signals C_en<1> and C_en<2>, respectively. Therefore, the coupling control circuit 420 may disable all the first to third coupling enable signals C_en<0:2> when only the first decoding signal Dec_s<0> is enabled among the first to fourth decoding signals Dec_s<0:3>.

If only the second decoding signal Dec_s<1> is enabled among the first to fourth decoding signals Dec_s<0:3>, the first inverter IV1 may receive the first decoding signal Dec_s<0> that is disabled (e.g., a logic low level), and may enable the first coupling enable signal C_en<0>. Since the OR gate OR1 and the second inverter IV2 receive the third and fourth decoding signals Dec_s<2:3> that are disabled, the OR gate OR1 and the third inverter IV3 may disable the second and third coupling enable signals C_en<1> and C_en<2>, respectively. Therefore, if only the second decoding signal Dec_s<1> is enabled among the first to fourth decoding signals Dec_s<0:3>, only the first coupling enable signal C_en<0> may be enabled among the first to third coupling enable signals C_en<0:2>.

If only the third decoding signal Dec_s<2> is enabled among the first to fourth decoding signals Dec_s<0:3>, the first inverter IV1 may receive the first decoding signal Dec_s<O> that is disabled (e.g., the low level), and may enable the first coupling enable signal C_en<O>. Since the OR gate OR1 receives the third decoding signal Dec_s<2> that is enabled, the OR gate OR1 may enable the second coupling enable signal C_en<1>. Since the second inverter IV2 receives the fourth decoding signal Dec_s<3> that is disabled, the third inverter IV3 may generate the third coupling enable signal C_en<2> that is disabled. Therefore, if only the third decoding signal Dec_s<2> is enabled among the first to fourth decoding signals Dec_s<0:3>, only the first and second coupling enable signals C_en<0:1> are enabled among the first to third coupling enable signals C_en<0:2>.

If only the fourth decoding signal Dec_s<3> is enabled among the first to fourth decoding signals Dec_s<0:3>, the first inverter IV1 receives the first decoding signal Dec_s<O> that is disabled to the low level, and may enable the first coupling enable signal C_en<O>. Since the OR gate OR1 receives the fourth decoding signal Dec_s<3> that is enabled, the OR gate OR1 may enable the second coupling enable signal C_en<1>. Since the second inverter IV2 receives the fourth decoding signal Dec_s<3> that is enabled, the third coupling enable signal C_en<2> may be enabled. Therefore, if only the fourth decoding signal Dec_s<3> is enabled among the first to fourth decoding signals Dec_s<0:3>, all the first to third coupling enable signals C_en<0:2> may be enabled.

Figure 3:
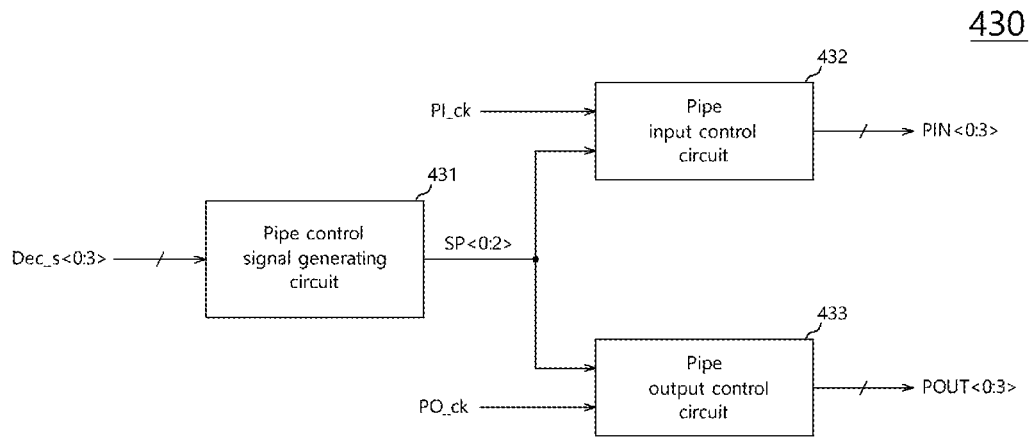
FIG. 3 is a diagram illustrating an example of the pipe input/output control circuit illustrated in FIG. 1.

In FIG. 3, the pipe input/output control circuit 430 may include a pipe control signal generating circuit 431, a pipe input control circuit 432, and a pipe output control circuit 433.

The pipe control signal generating circuit 431 may generate first to third pipe control signals SP<0:2> in response to the first to fourth decoding signals Dec_s<0:3>. For example, the pipe control signal generating circuit 431 may disable all the first to third pipe control signals SP<0:2> when the first decoding signal Dec_s<O> is in an enabled state. The pipe control signal generating circuit 431 may enable the first pipe control signal SP<O> when the second decoding signal Dec_s<1> is in an enabled state. The pipe control signal generating circuit 431 may enable the second pipe control signal SP<1> when the third decoding signal Dec_s<2> is in an enabled state. The pipe control signal generating circuit 431 may enable the third pipe control signal SP<2> when the fourth decoding signal Dec_s<3> is in an enabled state.

In an embodiment, the pipe input control circuit 432 may sequentially enable the first to fourth pipe input signals PIN<0:3> in response to the first to third pipe control signals SP<0:2> and the pipe input clock PI_ck. For example, the pipe input control circuit 432 may cyclically enable only the first pipe input signal PIN<O> in response to the pipe input clock PI_ck when all the first to third pipe control signals SP<0:2> are in disabled states. Here, the second to fourth pipe input signals PIN<1:3> may be fixed at a certain level. The pipe input control circuit 432 may sequentially enable the first and second pipe input signals PIN<0:1> in response to the pipe input clock PI_ck when the first pipe control signal SP<O> is in an enabled state. Here, the first and second pipe input signals PIN<0:1> may be cyclically enabled, and the third and fourth pipe input signals PIN<2:3> may be fixed at a certain level. The pipe input control circuit 432 may sequentially enable the first to third pipe input signals PIN<0:2> in response to the pipe input clock PI_ck when the second pipe control signal SP<1> is in an enabled state. Here, the first to third pipe input signals PIN<0:2> may be cyclically enabled, and the fourth pipe input signal PIN<3> may be fixed at a certain level. The pipe input control circuit 432 may sequentially enable the first to fourth pipe input signals PIN<0:3> in response to the pipe input clock PI_ck when the third pipe control signal SP<2> is in an enabled state. Here, the first to fourth pipe input signals PIN<0:3> may be cyclically enabled.

The pipe output control circuit 433 may sequentially enable the first to fourth pipe output signals POUT<0:3> in response to the first to third pipe control signals SP<0:2> and the pipe output clock PO_ck. For example, the pipe output control circuit 433 may cyclically enable only the first pipe output signal POUT<O> in response to the pipe output clock PO_ck when all the first to third pipe control signals SP<0:2> are in disabled states. Here, the second to fourth pipe output signals POUT<1:3> may be fixed at a certain level. The pipe output control circuit 433 may sequentially enable the first and second pipe output signals POUT<0:1> in response to the pipe output clock PO_ck when the first pipe control signal SP<0> is in an enabled state. Here, the first and second pipe output signals POUT<0:1> may be cyclically enabled, and the third and fourth pipe output signals POUT<2:3> may be fixed at a certain level. The pipe output control circuit 433 may sequentially enable the first to third pipe output signals POUT<0:2> in response to the pipe output clock PO_ck when the second pipe control signal SP<1> is in an enabled state. Here, the first to third pipe output signals POUT<0:2> may be cyclically enabled, and the fourth pipe output signal POUT<3> may be fixed at a certain level. The pipe output control circuit 433 may sequentially enable the first to fourth pipe output signals POUT<0:3> in response to the pipe output clock PO_ck when the third pipe control signal SP<2> is in an enabled state. Here, the first to fourth pipe output signals POUT<0:3> may be cyclically enabled.

Figure 4:
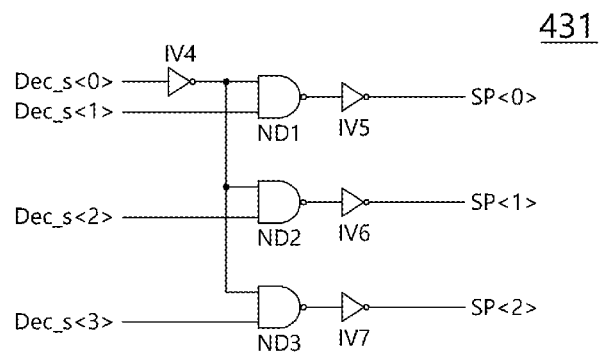
FIG. 4 is a diagram illustrating an example of the pipe control signal generating circuit illustrated in FIG. 3.

In FIG. 4, the pipe control signal generating circuit 431 may include fourth to seventh inverters IV4, IV5, IV6 and IV7 and first to third NAND gates ND1, ND2 and ND3. The fourth inverter IV4 may receive the first decoding signal Dec_s<0>. The first NAND gate ND1 may receive the output signal of the fourth inverter IV4 and the second decoding signal Dec_s<1>. The second NAND gate ND2 may receive the output signal of the fourth inverter IV4 and the third decoding signal Dec_s<2>. The third NAND gate ND3 may receive the output signal of the fourth inverter IV4 and the fourth decoding signal Dec_s<3>. The fifth inverter IV5 may output the first pipe control signal SP<0> in response to the output signal of the first NAND gate ND1. The sixth inverter IV6 may output the second pipe control signal SP<1> in response to the output signal of the second NAND gate ND2. The seventh inverter IV7 may output the third pipe control signal SP<2> in response to the output signal of the third NAND gate ND3.

The pipe input control circuit 432 and the pipe output control circuit 433 may be configured in the same way as one another except the signals input/output to/from them.

Thus, the following descriptions for the configuration of the pipe input control circuit 432 will replace descriptions for the configuration of the pipe output control circuit 433.

Figure 5:
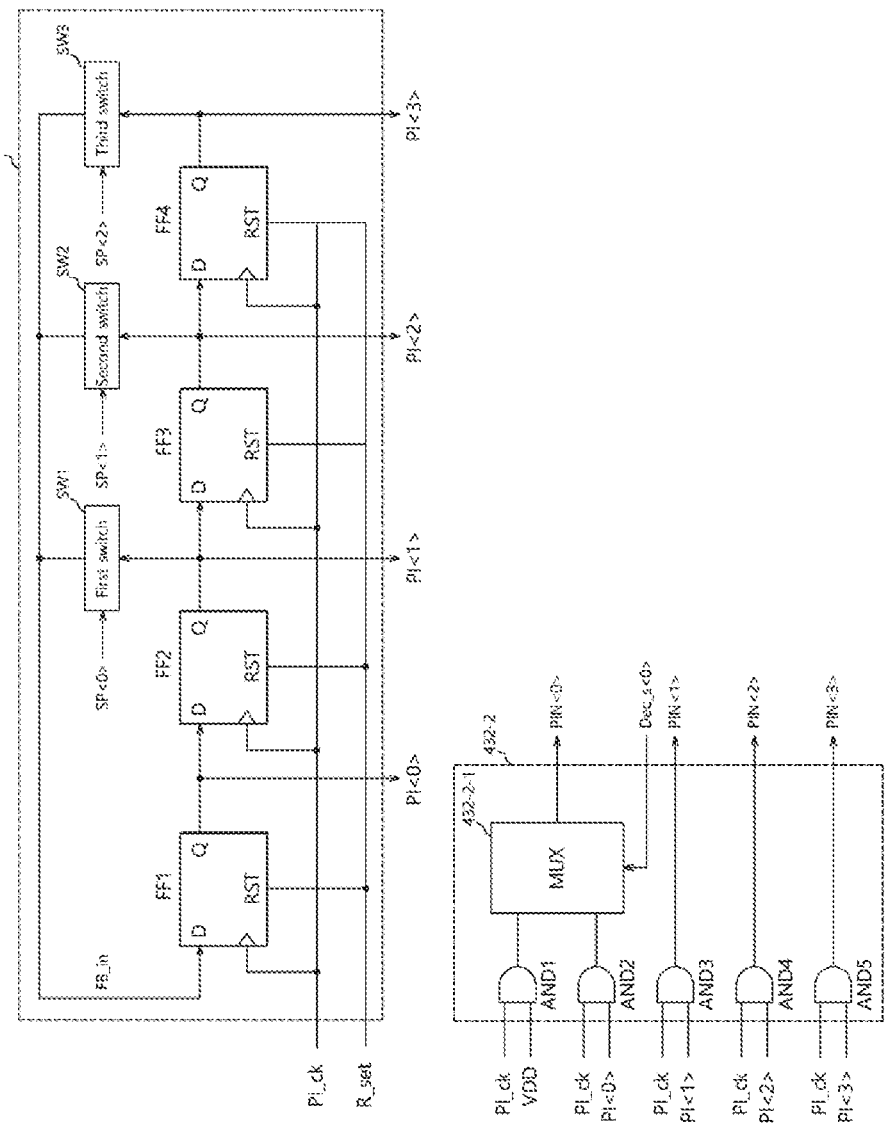
FIG. 5 is a diagram illustrating an example of the pipe input control circuit illustrated in FIG. 3.

In FIG. 5, the pipe input control circuit 432 may include a shifting part 432-1 and a synchronizing part 432-2.

In response to the first to third pipe control signals SP<0:2> and the pipe input clock PI_ck, the shifting part 432-1 may determine a number of first to fourth pipe input pluses PI<0:3> that are to be sequentially enabled. For example, if all the first to third pipe control signals SP<0:2> are disabled, the shifting part 432-1 may fix all the first to fourth pipe input pluses PI<0:3> to a certain level. The shifting part 432-1 may sequentially enable the first and second pipe input pulses PIN<0:1> in response to the pipe input clock PI_ck when the first pipe control signal SP<0> is in an enabled state. The shifting part 432-1 may sequentially enable the first to third pipe input pulses PIN<0:2> in response to the pipe input clock PI_ck when the second pipe control signal SP<1> is in an enabled state. The shifting part 432-1 may sequentially enable the first to fourth pipe input pulses PIN<0:3> in response to the pipe input clock PI_ck when the third pipe control signal SP<2> is in an enabled state.

The shifting part 432-1 may include first to fourth flip-flops FF1, FF2, FF3 and FF4 and first to third switches SW1, SW2 and SW3. The first flip-flop FF1 may have an input terminal receiving a feedback input signal FB_in, a clock input terminal receiving the pipe input clock PI_ck, and an output terminal outputting the first pipe input pulse PI<0>. The second flip-flop FF2 may have an input terminal receiving the first pipe input pulse PI<0>, a clock input terminal receiving the pipe input clock PI_ck, and an output terminal outputting the second pipe input pulse PI<1>. The third flip-flop FF3 may have an input terminal receiving the second pipe input pulse PI<1>, a clock input terminal receiving the pipe input clock PI_ck, and an output terminal outputting the third pipe input pulse PI<2>. The fourth flip-flop FF4 may have an input terminal receiving the third pipe input pulse PI<2>, a clock input terminal receiving the pipe input clock PI_ck, and an output terminal outputting the fourth pipe input pulse PI<3>. The first switch SW1 may output the second pipe input pulse PI<1> as the feedback input signal FB_in in response to the first pipe control signal SP<0>. For example, the first switch SW1 may output the second pipe input pulse PI<1> as the feedback input signal FB_in when the first pipe control signal SP<0> is in an enabled state. The second switch SW2 may output the third pipe input pulse PI<2> as the feedback input signal FB_in in response to the second pipe control signal SP<1>. For example, the second switch SW2 may output the third pipe input pulse PI<2> as the feedback input signal FB_in when the second pipe control signal SP<1> is in an enabled state. The third switch SW3 may output the fourth pipe input pulse PI<3> as the feedback input signal FB_in in response to the third pipe control signal SP<2>. For example, the third switch SW3 may output the fourth pipe input pulse PI<3> as the feedback input signal FB_in when the third pipe control signal SP<2> is in an enabled state.

The synchronizing part 432-2 may generate the first to fourth pipe input signals PIN<0:3> in response to the first to fourth pipe input pulses PI<0:3> and the pipe input clock PI_ck. For example, the synchronizing part 432-2 may output the pipe input clock PI_ck as the respective first to fourth pipe input signals PIN<0:3> when the first to fourth pipe input pulses PI<0:3> are at logic high levels. In detail, in response to the first decoding signal Dec_s<0>, the synchronizing part 432-2 may output the pipe input clock PI_ck as the first pipe input signal PIN<0> or output the pipe input clock PI_ck as the first pipe input signal PIN<0> when the first pipe input pulse PI<0> is at a logic high level. The synchronizing part 432-2 may output the pipe input clock PI_ck as the second pipe input signal PIN<1> when the second pipe input pulse PI<1> is at a logic high level. The synchronizing part 432-2 may output the pipe input clock PI_ck as the third pipe input signal PIN<2> when the third pipe input pulse PI<2> is at a logic high level. The synchronizing part 432-2 may output the pipe input clock PI_ck as the fourth pipe input signal PIN<3> when the fourth pipe input pulse PI<3> is at a logic high level.

The synchronizing part 432-2 may include first to fifth AND gates AND1, AND2, AND3, AND4 and AND5 and a multiplexer 432-2-1. The first AND gate AND1 may receive the pipe input clock PI_ck and an external voltage VDD. The second AND gate AND2 may receive the pipe input clock PI_ck and the first pipe input pulse PI<0>. The third AND gate AND3 may output the second pipe input signal PIN<1> in response to the pipe input clock PI_ck and the second pipe input pulse PI<1>. The fourth AND gate AND4 may output the third pipe input signal PIN<2> in response to the pipe input clock PI_ck and the third pipe input pulse PI<2>. The fifth AND gate AND5 may output the fourth pipe input signal PIN<3> in response to the pipe input clock PI_ck and the fourth pipe input pulse PI<3>. The multiplexer 432-2-1 may output one of the output signals of the first and second AND gates AND1 and AND2 as the first pipe input signal PIN<0> in response to the first decoding signal Dec_s<0>. For example, the multiplexer 432-2-1 may output the output signal of the first AND gate AND1 as the first pipe input signal PIN<0> when the first decoding signal Dec_s<0> is in an enabled state, and may output the output signal of the second AND gate AND2 as the first pipe input signal PIN<0> when the first decoding signal Dec_s<0> is in a disabled state.

The semiconductor memory apparatus in accordance with an embodiment may operate as follows.

By using only one pipe register 210 selected between the first to fourth pipe registers 210, 220, 230 and 240, an operation of transferring data output from the data storage region 100 to the output driver 300 may be performed as discussed below.

The decoder 410 may enable the first decoding signal Dec_s<0> in response to the memory setting signals MRS_s<0:1>.

The coupling control circuit 420 may disable all the first to third coupling enable signals C_en<0:2> when the first decoding signal Dec_s<0> is in an enabled state.

Referring to FIG. 6 (A), the pipe input/output control circuit 430 may cyclically enable only the first pipe input signal PIN<0> among the first to fourth pipe input signals PIN<0:3> when the first decoding signal Dec_s<0> is in an enabled state. Also, the pipe input/output control circuit 430 may cyclically enable the first pipe output signal POUT<0> when the first decoding signal Dec_s<0> is in an enabled state. At this time, all the second to fourth pipe input signals PIN<1:3> and the second to fourth pipe output signals POUT<1:3> may be fixed at a certain level.

In response to the first to third coupling enable signals C_en<0:2> disabled, the first to sixth coupling circuits 211, 212, 221, 222, 231 and 232 may prevent the pipe input data PIN_D from being transferred to the second to fourth pipe registers 220, 230 and 240 and prevent the output signals of the second to fourth pipe registers 220, 230 and 240 from being output as the pipe output data POUT_D. Therefore, the pipe input data PIN_D may be transferred to only the first pipe register 210, and only the output signal of the first pipe register 210 may be output as the pipe output data POUT_D.

The first pipe register 210 may store the pipe input data PIN_D in response to the first pipe input signal PIN<0> that is cyclically enabled, and may output stored data as the pipe output data POUT_D in response to the first pipe output signal POUT<0> that is cyclically enabled.

The output driver 300 may drive the pipe output data POUT_D and transmit the output data DQ.

By using only two pipe registers (e.g., the first and second pipe registers 210 and 220) selected between the first to fourth pipe registers 210, 220, 230 and 240, an operation of transferring data output from the data storage region 100 to the output driver 300 may be performed as discussed below.

The decoder 410 may enable the second decoding signal Dec_s<1> in response to the memory setting signals MRS_s<0:1>.

The coupling control circuit 420 may enable the first coupling enable signal C_en<0> when the second decoding signal Dec_s<1> is in an enabled state.

Referring to FIG. 6 (B), the pipe input/output control circuit 430 may sequentially and cyclically enable the first and second pipe input signals PIN<0> and PIN<1> when the second decoding signal Dec_s<1> is in an enabled state. Also, the pipe input/output control circuit 430 may sequentially and cyclically enable the first and second pipe output signals POUT<0> and POUT<1> when the second decoding signal Dec_s<1> is in an enabled state. At this time, the third and fourth pipe input signals PIN<2:3> and the third and fourth pipe output signals POUT<2:3> may be fixed at a certain level.

Among the first to sixth coupling circuits 211, 212, 221, 222, 231 and 232, only the first and second coupling circuits 211 and 212 may transfer the pipe input data PIN_D to the second pipe register 220 and output the output signal of the second pipe register 220 as the pipe output data POUT_D in response to the first coupling enable signal C_en<0> enabled. In response to the second and third coupling enable signals C_en<1:2> that are disabled, the third to sixth coupling circuits 221, 222, 231 and 232 may prevent the pipe input data PIN_D from being transferred to the third and fourth pipe registers 230 and 240 and prevent the output signals of the third and fourth pipe registers 230 and 240 from being outputted as the pipe output data POUT_D. Therefore, the pipe input data PIN_D may be transferred to only the first and second pipe registers 210 and 220, and only the output signals of the first and second pipe registers 210 and 220 may be output as the pipe output data POUT_D.

The first pipe register 210 may store the pipe input data PIN_D in response to the first pipe input signal PIN<0> that is cyclically enabled, and may output stored data as the pipe output data POUT_D in response to the first pipe output signal POUT<0> that is cyclically enabled.

The second pipe register 220 may store the pipe input data PIN_D in response to the second pipe input signal PIN<1> that is cyclically enabled, and may output stored data as the pipe output data POUT_D in response to the second pipe output signal POUT<1> that is cyclically enabled.

The output driver 300 may drive the pipe output data POUT_D and transmit the output data DQ.

By using only three pipe registers (e.g., the first to third pipe registers 210, 220 and 230) selected between the first to fourth pipe registers 210, 220, 230 and 240, an operation of transferring data output from the data storage region 100 to the output driver 300 may be performed as discussed below.

The decoder 410 may enable the third decoding signal Dec_s<2> in response to the memory setting signals MRS_s<0:1>.

The coupling control circuit 420 may enable the first and second coupling enable signals C_en<0> and C_en<1> when the third decoding signal Dec_s<2> is in an enabled state.

Referring to FIG. 6 (C), the pipe input/output control circuit 430 may sequentially and cyclically enable the first to third pipe input signals PIN<0>, PIN<1> and PIN<2> when the third decoding signal Dec_s<2> is in an enabled state. Also, the pipe input/output control circuit 430 may sequentially and cyclically enable the first to third pipe output signals POUT<0>, POUT<1> and POUT<2> when the third decoding signal Dec_s<2> is in an enabled state. At this time, both the fourth pipe input signal PIN<3> and the fourth pipe output signal POUT<3> may be fixed at a certain level.

Among the first to sixth coupling circuits 211, 212, 221, 222, 231 and 232, only the first to fourth coupling circuits 211, 212, 221 and 222 may transfer the pipe input data PIN_D to the second and third pipe registers 220 and 230 and output the output signals of the second and third pipe registers 220 and 230 as the pipe output data POUT_D in response to the first and second coupling enable signals C_en<0> and C_en<1> enabled.

In response to the third coupling enable signal C_en<2> that is disabled, the fifth and sixth coupling circuits 231 and 232 may prevent the pipe input data PIN_D from being transferred to the fourth pipe register 240 and prevent the output signal of the fourth pipe register 240 from being outputted as the pipe output data POUT_D. Therefore, the pipe input data PIN_D may be transferred to only the first to third pipe registers 210, 220 and 230, and only the output signals of the first to third pipe registers 210, 220 and 230 may be output as the pipe output data POUT_D.

The first pipe register 210 may store the pipe input data PIN_D in response to the first pipe input signal PIN<0> that is cyclically enabled, and may output stored data as the pipe output data POUT_D in response to the first pipe output signal POUT<0> that is cyclically enabled.

The second pipe register 220 may store the pipe input data PIN_D in response to the second pipe input signal PIN<1> that is cyclically enabled, and may output stored data as the pipe output data POUT_D in response to the second pipe output signal POUT<1> that is cyclically enabled.

The third pipe register 230 may store the pipe input data PIN_D in response to the third pipe input signal PIN<2> that is cyclically enabled, and may output stored data as the pipe output data POUT_D in response to the third pipe output signal POUT<2> that is cyclically enabled.

The output driver 300 may drive the pipe output data POUT_D and transmit the output data DQ.

By using all of the first to fourth pipe registers 210, 220, 230 and 240, an operation of transferring data outputted from the data storage region 100 to the output driver 300 may be performed as discussed below.

The decoder 410 may enable the fourth decoding signal Dec_s<3> in response to the memory setting signals MRS_s<0:1>.

The coupling control circuit 420 may enable all the first to third coupling enable signals C_en<0:2> when the fourth decoding signal Dec_s<3> is in an enabled state.

Referring to FIG. 6 (D), the pipe input/output control circuit 430 may sequentially and cyclically enable the first to fourth pipe input signals PIN<0:3> when the fourth decoding signal Dec_s<3> is in an enabled state. Also, the pipe input/output control circuit 430 may sequentially and cyclically enable the first to fourth pipe output signals POUT<0:3> when the fourth decoding signal Dec_s<3> is in an enabled state.

In response to the first to third coupling enable signals C_en<0:2> that are enabled, all of the first to sixth coupling circuits 211, 212, 221, 222, 231 and 232 may transfer the pipe input data PIN_D to the second to fourth pipe registers 220, 230 and 240 and output the output signals of the second to fourth pipe registers 220, 230 and 240 as the pipe output data POUT_D.

Therefore, the pipe input data PIN_D may be transferred to all of the first to fourth pipe registers 210, 220, 230 and 240, and the output signals of the first to fourth pipe registers 210, 220, 230 and 240 may be output as the pipe output data POUT_D.

The first pipe register 210 may store the pipe input data PIN_D in response to the first pipe input signal PIN<0> that is cyclically enabled, and may output stored data as the pipe output data POUT_D in response to the first pipe output signal POUT<0> that is cyclically enabled.

The second pipe register 220 may store the pipe input data PIN_D in response to the second pipe input signal PIN<1> that is cyclically enabled, and may output stored data as the pipe output data POUT_D in response to the second pipe output signal POUT<1> that is cyclically enabled.

The third pipe register 230 may store the pipe input data PIN_D in response to the third pipe input signal PIN<2> that is cyclically enabled, and may output stored data as the pipe output data POUT_D in response to the third pipe output signal POUT<2> that is cyclically enabled.

The fourth pipe register 240 may store the pipe input data PIN_D in response to the fourth pipe input signal PIN<3> that is cyclically enabled, and may output stored data as the pipe output data POUT_D in response to the fourth pipe output signal POUT<3> that is cyclically enabled.

The output driver 300 may drive the pipe output data POUT_D and transmit the output data DQ.

As discussed above, the semiconductor memory apparatus in accordance with an embodiment may adjust, in response to the memory setting signals MRS_s<0:1>, the number of pipe registers receiving the pipe input data PIN_D and outputting the pipe output data POUT_D. In an embodiment, a pipe register group may include multiple pipe registers, and the number of pipe registers that are used for a certain operation may be adjusted by partitioning the pipe register group. For example, the semiconductor memory apparatus in accordance with an embodiment may use only a part of the total number of pipe registers or may use the total number of pipe registers. The semiconductor memory apparatus in accordance with an embodiment may determine how many pipe registers will be used depending on the memory setting signals MRS_s<0:1>.

While various embodiments have been described above, it will be understood to those skilled in the art that the embodiments described are examples only. Accordingly, the semiconductor memory apparatus described herein should not be limited based on the described embodiments.

What is claimed is:

1. A semiconductor memory apparatus comprising:
   a data storage region configured to store data and output stored data as pipe input data;
   a pipe register group including a plurality of pipe registers; and
   an output driver configured to drive the pipe output data and transmit output data,
   wherein the pipe register group determines the number of pipe registers receiving the pipe input data in response to a plurality of coupling enable signals and a plurality of pipe input signals and determines the number of pipe registers outputting pipe output data in response to the plurality of coupling enable signals and a plurality of pipe output signals.

2. The semiconductor memory apparatus according to claim 1, wherein the pipe register group comprises a plurality of coupling circuits transferring the pipe input data to the pipe registers and transmitting output signals of the pipe registers as the pipe output data in response to the plurality of coupling enable signals.

3. The semiconductor memory apparatus according to claim 2, wherein the plurality of coupling circuits comprises first to fourth coupling circuits, and the plurality of coupling enable signals comprises first and second coupling enable signals, and the pipe register group comprises:
   a first pipe register configured to store the pipe input data and output a stored signal as the pipe output data;
   a first coupling circuit configured to transfer the pipe input data to the second pipe register in response to the first coupling enable signal;
   a second coupling circuit configured to output an output signal of the second pipe register as the pipe output data in response to the first coupling enable signal;
   a second pipe register configured to store the pipe input data transferred through the first coupling circuit and output a stored signal;
   a third coupling circuit configured to transfer, in response to the second coupling enable signal, the pipe input data, which have been transferred through the first coupling circuit, to the third pipe register;
   a fourth coupling circuit configured to transfer, in response to the second coupling enable signal, an output signal of the third pipe register to be output as the pipe output data to the second coupling circuit; and a third pipe register configured to store the pipe input data transferred through the third coupling circuit and output a stored signal.

4. The semiconductor memory apparatus according to claim 3, wherein:
the plurality of pipe input signals comprise first to third pipe input signals;
the plurality of pipe output signals comprise first to third pipe output signals;
the first pipe register stores the pipe input data in response to the first pipe input signal, and outputs a stored signal as the pipe output data in response to the first pipe output signal;
the second pipe register stores the pipe input data transferred through the first coupling circuit in response to the second pipe input signal, and outputs a stored signal to the second coupling circuit in response to the second pipe output signal; and
the third pipe register stores the pipe input data transferred through the third coupling circuit in response to the third pipe input signal, and outputs a stored signal to the fourth coupling circuit in response to the third pipe output signal.

5. A semiconductor memory apparatus comprising:
a pipe register control circuit configured to generate a plurality of coupling enable signals, a plurality of pipe input signals and a plurality of pipe output signals in response to memory setting signals; and
a pipe register group including a plurality of pipe registers which store pipe input data in response to the plurality of coupling enable signals and the plurality of pipe input signals, and which output stored signals as pipe output data in response to the plurality of coupling enable signals and the plurality of pipe output signals.

6. The semiconductor memory apparatus according to claim 5, wherein the pipe register control circuit comprises:
a decoder configured to decode the memory setting signals and generate a plurality of decoding signals;
a coupling control circuit configured to generate the plurality of coupling enable signals in response to the plurality of decoding signals; and
a pipe input/output control circuit configured to generate the plurality of pipe input signals and the plurality of pipe output signals in response to the plurality of decoding signals.

7. The semiconductor memory apparatus according to claim 6, wherein, in response to the plurality of decoding signals, the coupling control circuit determines a number of coupling enable signals selected among the plurality of coupling enable signals to be enabled.

8. The semiconductor memory apparatus according to claim 7, wherein the plurality of coupling enable signals comprise first and second coupling enable signals, and the coupling control circuit enables, in response to the plurality of decoding signals, the first coupling enable signal or enables both the first and second coupling enable signals.

9. The semiconductor memory apparatus according to claim 6, wherein, in response to the plurality of decoding signals, the pipe input/output control circuit determines a number of pipe input signals and a number of pipe output signals selected among the plurality of pipe input signals and the plurality of pipe output signals to be sequentially enabled.

10. The semiconductor memory apparatus according to claim 9, wherein the pipe input/output control circuit comprises:

a pipe control signal generating circuit configured to selectively enable a plurality of pipe control signals in response to the plurality of decoding signals;
a pipe input control circuit configured to generate the plurality of pipe input signals sequentially enabled in response to the plurality of pipe control signals and a pipe input clock; and
a pipe output control circuit configured to generate the plurality of pipe output signals sequentially enabled in response to the plurality of pipe control signals and a pipe output clock.

11. The semiconductor memory apparatus according to claim 10, wherein, in response to the plurality of pipe control signals and the pipe input clock, the pipe input control circuit determines a number of pipe input signals to be sequentially enabled.

12. The semiconductor memory apparatus according to claim 10, wherein, in response to the plurality of pipe control signals and the pipe output clock, the pipe output control circuit determines a number of pipe output signals to be sequentially enabled.

13. The semiconductor memory apparatus according to claim 5, wherein the pipe register group comprises:
the plurality of pipe registers configured store the pipe input data and output stored signals as the pipe output data in response to the plurality of pipe input signals and the plurality of pipe output signals; and
a plurality of coupling circuits configured to, in response to the plurality of coupling enable signals, selectively transfer the pipe input data to the plurality of pipe registers and selectively transmit output signals of the plurality of pipe registers as the pipe output data.

14. A semiconductor memory apparatus comprising:
a pipe register control circuit configured to generate a plurality of coupling enable signals in response to memory setting signals; and
a pipe register group including a plurality of pipe registers,
wherein the pipe register group determines the number of pipe registers receiving the pipe input data in response to a plurality of coupling enable signals and a plurality of pipe input signals and determines the number of pipe registers outputting pipe output data in response to the plurality of coupling enable signals and a plurality of pipe output signals.

15. The semiconductor memory apparatus according to claim 14, wherein, in response to the memory setting signals, the pipe register control circuit determines a number of coupling enable signals selected among the plurality of coupling enable signals to be enabled.

16. The semiconductor memory apparatus according to claim 15, wherein, in response to a number of coupling enable signals enabled, the pipe register group determines a number of pipe registers storing the pipe input data and outputting stored signals as the pipe output data.

17. The semiconductor memory apparatus according to claim 16, wherein the plurality of coupling circuits comprises first to fourth coupling circuits, and the plurality of coupling enable signals comprises first and second coupling enable signals, and the pipe register group comprises:
a first pipe register configured to store the pipe input data and output a stored signal as the pipe output data;
a first coupling circuit configured to transfer the pipe input data to the second pipe register when the first coupling enable signal is enabled;

a second coupling circuit configured to output an output signal of the second pipe register as the pipe output data in response to the first coupling enable signal;

a second pipe register configured to store the pipe input data transferred through the first coupling circuit, and output a stored signal, a third coupling circuit configured to transfer, in response to the second coupling enable signal, the pipe input data, which have been transferred through the first coupling circuit, to the third pipe register;

a fourth coupling circuit configured to transfer, in response to the second coupling enable signal, an output signal of the third pipe register to be output as the pipe output data to the second coupling circuit; and a third pipe register configured to store the pipe input data transferred through the third coupling circuit and output a stored signal.

\* \* \* \* \*